United States Patent
Klaasen et al.

(10) Patent No.: US 6,750,530 B1
(45) Date of Patent: Jun. 15, 2004

(54) SEMICONDUCTOR ANTIFUSE WITH HEATING ELEMENT

(75) Inventors: William A. Klaasen, Underhill, VT (US); Alvin W. Strong, Essex Junction, VT (US); Ernest Y. Wu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/250,093

(22) Filed: Jun. 3, 2003

(51) Int. Cl.[7] .............................................. H01L 29/00
(52) U.S. Cl. ..................................................... 257/530
(58) Field of Search ................................. 257/529, 530

(56) References Cited

U.S. PATENT DOCUMENTS 6,288,437 B1 * 9/2001 Forbes et al.

* cited by examiner

Primary Examiner—Fetsum Abraham
(74) Attorney, Agent, or Firm—Schmeiser, Olsen & Watts; Steven Capella (57) ABSTRACT

A programmable device including: an antifuse; a resistive heating element having a substantially temperature to power response, the resistive heating element adjacent to but not in contact with the antifuse; and means for passing an electric current through the resistive heating element in order to generate heat to raise the temperature of the antifuse sufficiently high enough to decrease a programming voltage of the antifuse, a time the programming voltage is applied to the antifuse or both the programming voltage of the antifuse and the time the programming voltage is applied to the antifuse.

20 Claims, 7 Drawing Sheets

SEMICONDUCTOR ANTIFUSE WITH HEATING ELEMENT

BACKGROUND OF INVENTION

The present invention relates to user-programmable antifuse devices; more specifically, it relates to combinations of antifuse devices and antifuse heater elements and the method of programming antifuse devices having antifuse heater elements.

An antifuse is a programming device that is essentially an open circuit before programming and a closed circuit after programming. One type of antifuse is a capacitive antifuse. A capacitive antifuse is a structure composed of an insulator with a conductive plate on opposite sides of the insulator. The antifuse is programmed by applying a voltage across the two plates sufficient to break down the insulator between the plates, thus shorting the plates together.

Generally, very high voltages are required to program an antifuse. This presents two problems in applying antifuse technology to advanced semiconductor chips. First, the programming voltage may be so much higher than devices of a semiconductor chip are designed to withstand that damage to the devices results when the antifuses are programmed. Second, in certain applications, the high programming voltage may not be available on the semiconductor chip. The conventional method of overcoming these two problems has been to try to use a lower than ideal voltage for a shorter time. However, this approach results in increased process time and costs as well as decreased reliability in terms of the programmed antifuse staying programmed, i.e. staying shorted and not opening up over the life of the chip, thus causing chip failure in the field.

SUMMARY OF INVENTION

A first aspect of the present invention is a programmable device comprising: an antifuse; a resistive heating element having a substantially linear temperature to power response, the resistive heating element adjacent to but not in contact with the antifuse; and means for passing an electric current through the resistive heating element in order to generate heat to raise the temperature of the antifuse sufficiently high enough to decrease a programming voltage of the antifuse, a time the programming voltage is applied to the antifuse or both the programming voltage of the antifuse and the time the programming voltage is applied to the antifuse.

A second aspect of the present invention is a method of programming an antifuse comprising: providing an antifuse; providing a resistive heating element having a substantially temperature to power response, the resistive heating element adjacent to but not in contact with the antifuse; passing an electric current through the resistive heating element in order to generate heat to raise the temperature of the antifuse sufficiently high enough to decrease a programming voltage of the antifuse, a time the programming voltage is applied to the antifuse or both the programming voltage of the antifuse and the time the programming voltage is applied to the antifuse; and passing the programming voltage through the antifuse to form an electrically conductive path through the antifuse.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 8B1 is a partial cross-sectional view through line 8B—8B of FIG. 8A of a first variant of the third embodiment of an antifuse structure having a heating element.

FIG. 8B2 is a partial cross-sectional view through line 8B—8B of FIG. 8A of a second variant of the third embodiment of an antifuse structure having a heating element.

FIG. 8B3 is a partial cross-sectional view through line 8B—8B of FIG. 8A of a third variant of the third embodiment of an antifuse structure having a heating element.

FIG. 11 is a partial cross-sectional view of a sixth embodiment of the present invention; and.

DETAILED DESCRIPTION

Figure 1:
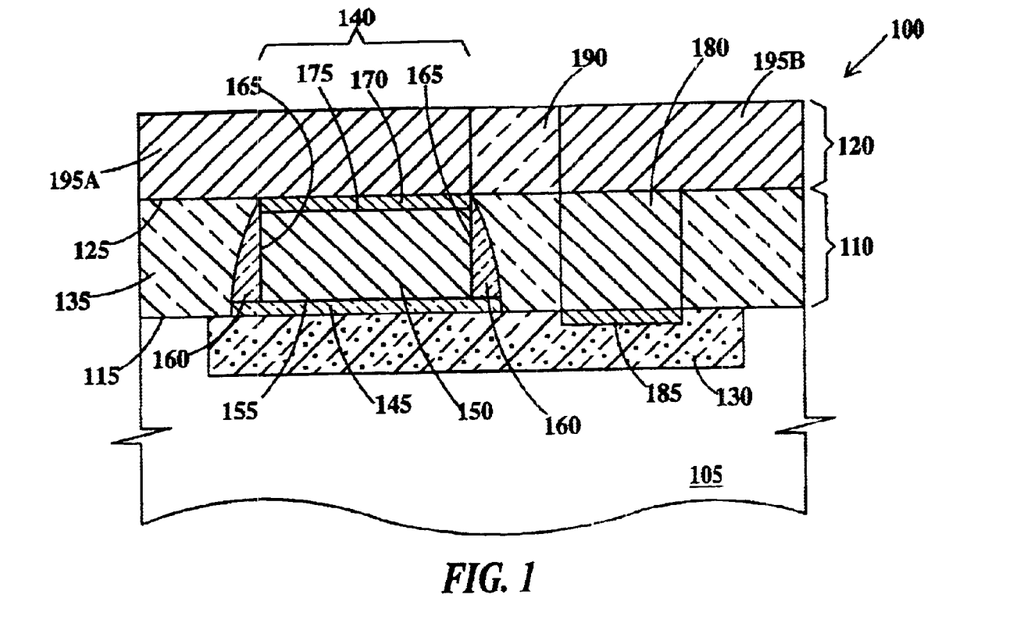
FIG. 1 is a partial cross-sectional view of an antifuse of a first type according to the present invention.

FIG. 1 is a partial cross-sectional view of an antifuse of a first type according to the present invention. In FIG. 1, programmable circuit 100 includes a substrate 105, a device level 110 formed on a top surface 115 of the substrate and a wiring level 120 formed on a top surface 125 of the device level. In one example, substrate 105 comprises silicon. A doped region 130, extending to top surface 115 of substrate 105 is formed in the substrate.

Formed in a first insulating layer 135 of device level 110 is an antifuse 140. Doped region 125 acts as a lower plate of an antifuse 140. Antifuse 140 further includes a dielectric layer 145 formed on top surface 115 of substrate 105. Dielectric layer 145 is in contact with doped region 130. Antifuse 140 still further includes an upper conductive plate 150 formed on a top surface 155 of dielectric layer 145. Optional insulating spacers 160 may be formed on sidewalls 165 of upper conductor plate 150. In one example, dielectric layer 145 is 1.0 nm to 4.0 nm thick silicon dioxide and upper conductive plate 150 is polysilicon, doped polysilicon or a metal such as aluminum, copper, or tungsten or alloys of aluminum, copper, or tungsten. In the case that upper conductive plate 145 is polysilicon, a metal silicide layer 170 is optionally formed on a top surface 175 of the conductor.

An electrically conductive contact 180 is also formed in device level 110. Device level 110 is called a device level, as this is the level that the gates of conventional complimentary-metal-oxide-silicon (CMOS) transistors are formed in. Contact 180 optionally contacts a metal silicide layer 185 formed in doped region 130 and extending from top surface 115 of substrate 105. Formed in an insulating layer 190 of wiring level 120 is a first conductor 195A connecting to upper gate conductor 150 (through silicide layer 170) and a second conductor 195B connecting to doped region 130 through contact 180.

In order to program antifuse 140, sufficient power (voltage times current) for a sufficient duration of time is applied across first and second conductors 195A and 195B to cause a breakdown in dielectric layer 145, thus shorting upper conductive plate 150 to doped region 130. Typical programming voltages range from 3 to 5 volts. The exact programming voltage and time duration are a function of the temperature of dielectric layer 150 as discussed infra.

Figure 2A:
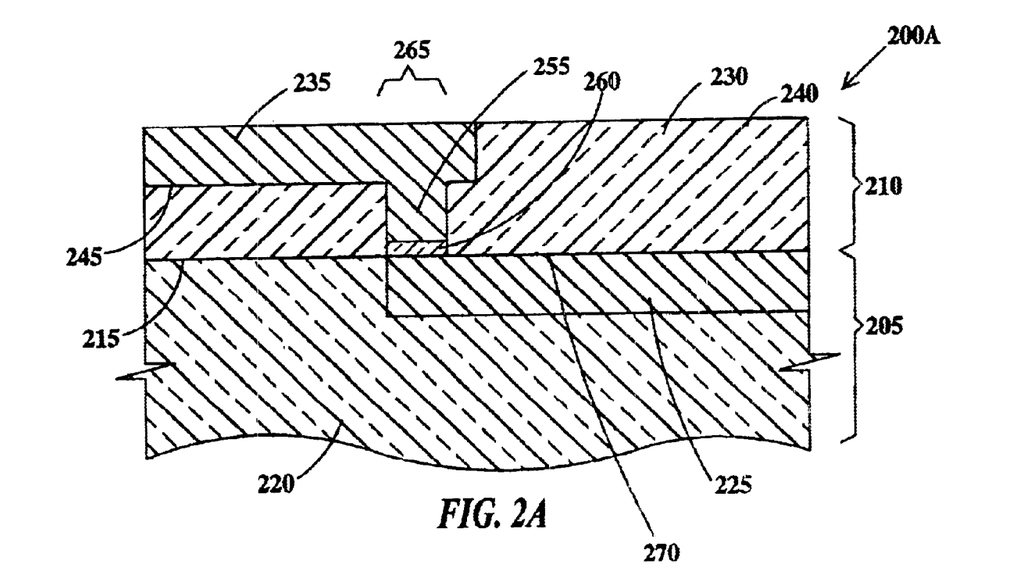
FIG. 2A is a partial cross-sectional view of a first variant of an antifuse of the second type according to the present invention.

FIG. 2A is a partial cross-sectional view of a first variant of an antifuse of the second type according to the present invention. In FIG. 2A, programmable circuit 200A includes a first wiring level 205 formed on a substrate (not shown) and a second wiring level 210 formed on a top surface 215 of the first wiring level. Formed in a first interlevel dielectric 220 of first wiring level 205, and extending to top surface 215 of the first wiring level is a first conductor 225. Formed in a second interlevel dielectric 230 of second wiring level 210 is a second conductor 235 extending into the second interlevel dielectric from a top surface 240 of the second wiring level. Second conductor 235 does not contact first conductor 225. Extending from a bottom surface 245 of second conductor 235 toward an upper surface 270 of first conductor 225 is a conductive via 255. Conductive via 255 may be integrally formed with second conductor 235 or formed separately, but in electrical contact with the second conductor. A dielectric layer 260 is formed between conductive via 255 and first conductor 225. In one example, dielectric layer 260 is 1.0 nm to 4.0 nm thick silicon dioxide and first and second conductors 225 and 235 are doped polysilicon or a metal such as aluminum, copper, or tungsten or alloys of aluminum, copper, or tungsten. First and second conductors may also include one or more layers of titanium, titanium nitride, tantalum or tantalum nitride or combinations thereof. Conductive via 255, dielectric layer 260 and that portion of first conductor 225 in contact with the dielectric layer form an antifuse 265.

In order to program antifuse 265, sufficient power (voltage times current) for a sufficient duration of time is applied across first and second conductors 225 and 235 to cause a breakdown in dielectric layer 260, thus shorting upper conductive via 255 to that portion of first conductor 225 in contact with the dielectric layer. Typical programming voltages range from 3 to 5 volts. The exact programming voltage and time duration are a function of the temperature of dielectric layer 260 as discussed infra.

Figure 2B:
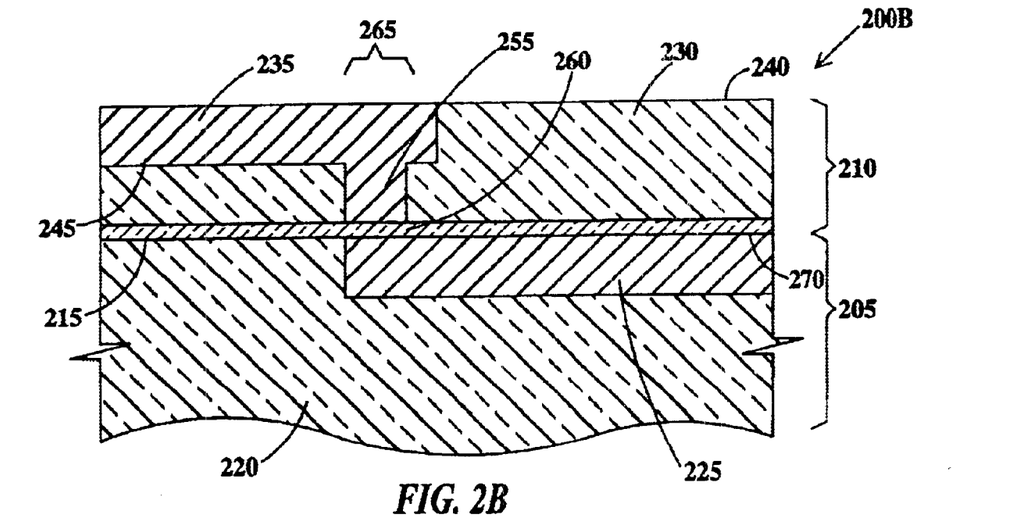
FIG. 2B is a partial cross-sectional view of a second variant of an antifuse of the second type according to the present invention.

FIG. 2B is a partial cross-sectional view of a second variant of an antifuse of the second type according to the present invention. In FIG. 2B, programmable circuit 200B is similar to programming circuit 200A of FIG. 2A except that dielectric layer 260 is additionally formed on top surface 215 of first interlevel dielectric 220 as well as a top surface 270 of first conductor 225.

Figure 2C:
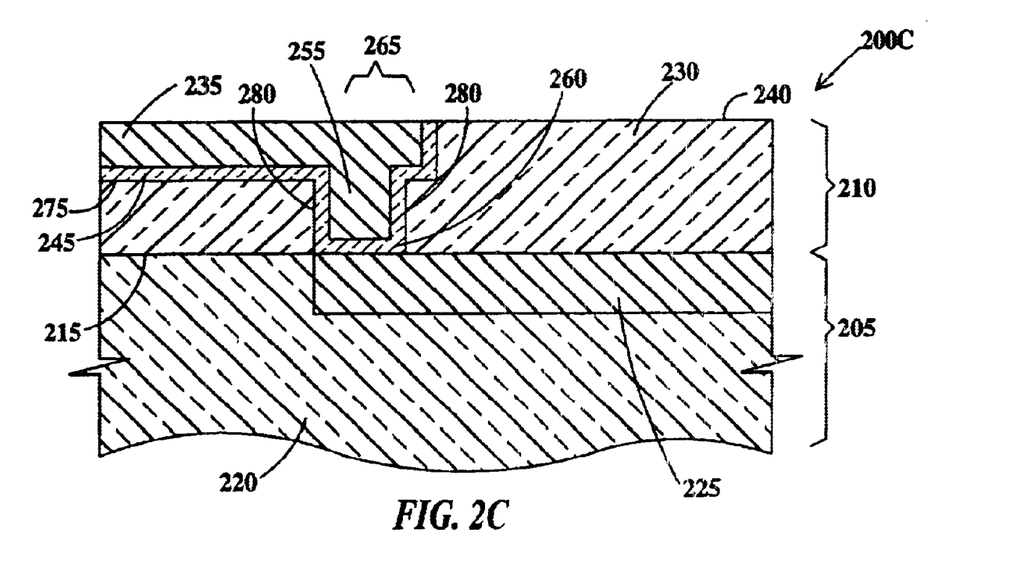
FIG. 2C is a partial cross-sectional view of a third variant of an antifuse of the second type according to the present invention.

FIG. 2C is a partial cross-sectional view of a third variant of an antifuse of the second type according to the present invention. In FIG. 2C, programmable circuit 200C is similar to programming circuit 200A of FIG. 2A except that dielectric layer 260 is additionally formed as a liner between a bottom surface 275 of second conductor 235 and on sidewalls 280 of conductive via 255.

Figure 3:
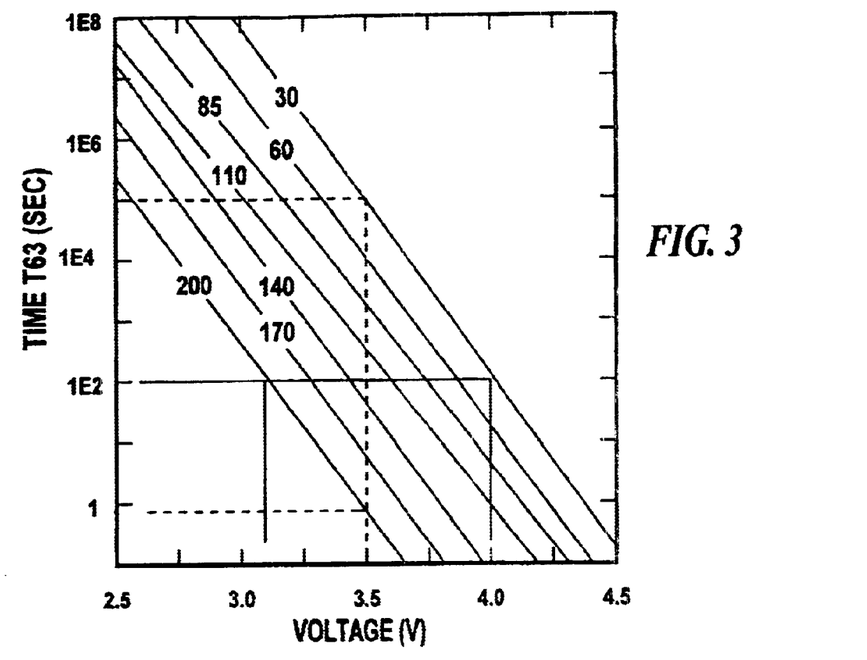
FIG. 3 is a series of plots representing the time to breakdown of an antifuse structure versus voltage applied to the antifuse as a function of temperature.

FIG. 3 is a series of curves representing the time to breakdown of an antifuse structure versus voltage applied to the antifuse as a function of temperature. In FIG. 3, seven curves labeled 30, 60, 85, 110, 140, 170 and 210 of $T_{63}$ versus voltage corresponding to temperatures of 30° C., 60° C., 85° C., 110° C., 140° C., 170° C. and 210° C. respectively were experimentally determined. The structure used was an antifuse similar to that illustrated in FIG. 1 and described supra, having a thin silicon oxide dielectric 2.15 nm thick. For each curve 30, 60, 85, 110, 140, 170 and 210, a group of at least 40 capacitors or antifuse structures were maintained at the respective temperature and the time $T_{63}$ measured as for a selected voltage applied across the dielectric. $T_{63}$ is the time required for 63% of the antifuse structures in the group to register a short circuit, indicating the thin silicon oxide dielectric had broken down.

As can be seen from FIG. 3, either the $T_{63}$ time to breakdown at a given applied voltage decreases as temperature increases or for a given $T_{63}$, the voltage required for breakdown decreases as temperature increases. For example, at $T_{63}$=about 100 seconds the voltage required decreases from about 4 volts at about 30° C. to about 3.1 volts at about 200° C. As a second example, for a voltage of about 3.5 volts, $T_{63}$ decreases from about 100,000 seconds at about 30° C. to about 1 second at about 200° C.

Figure 4:
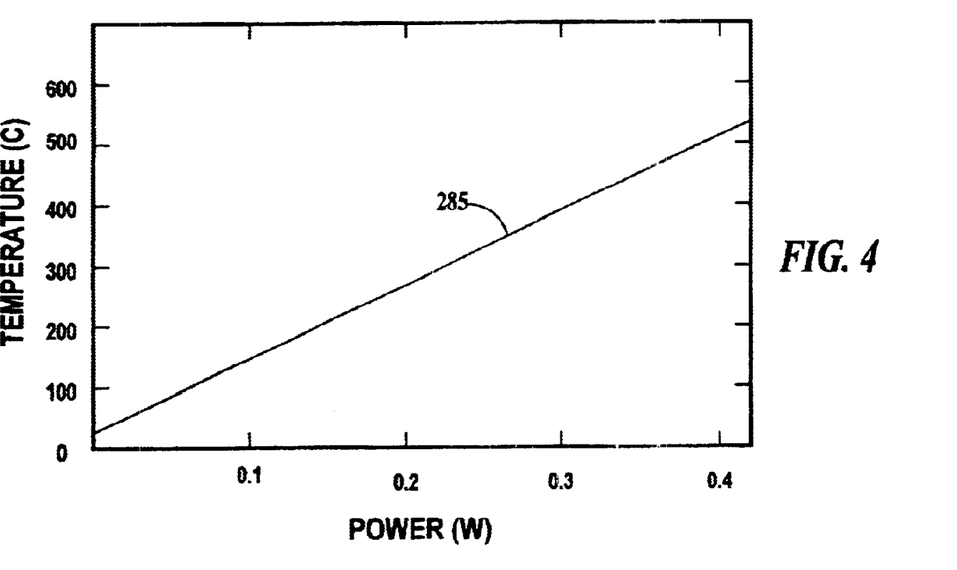
FIG. 4 is a plot of temperature versus power for a conductive line undergoing joule heating.

FIG. 4 is a plot of temperature versus power for a conductive line undergoing joule heating. An AlCu line surrounded by oxide was fabricated. The AlCu line was 300 microns long, 0.21 microns wide and 300 nm thick. The line was also finite element modeled. To simulate joule heating, the line was modeled to generate heat per volume for a specific current density. Heat generation per volume can be defined by equation (1): $H_V = j^2 (1 + α (T - T_s))(1)$ where: $H_V$ is the heat generated per unit of volume; j is the current density; $α$ is the temperature coefficient of resistance for the line material (0.0021/°K for tungsten, 0.0031/°K for aluminum); T is the temperature reached by the line; $T_s$ is the reference temperature for $α$; and $ρ$ is the resistivity of the material of the line.

Curve 285 of FIG. 4 is the experimentally measured results and yields a straight line with a slope of 1200° C./Watt compared to the finite model result of 1264° C./Watt (not shown) using j=400 mA/$μ$m$^2$.

Figure 5:
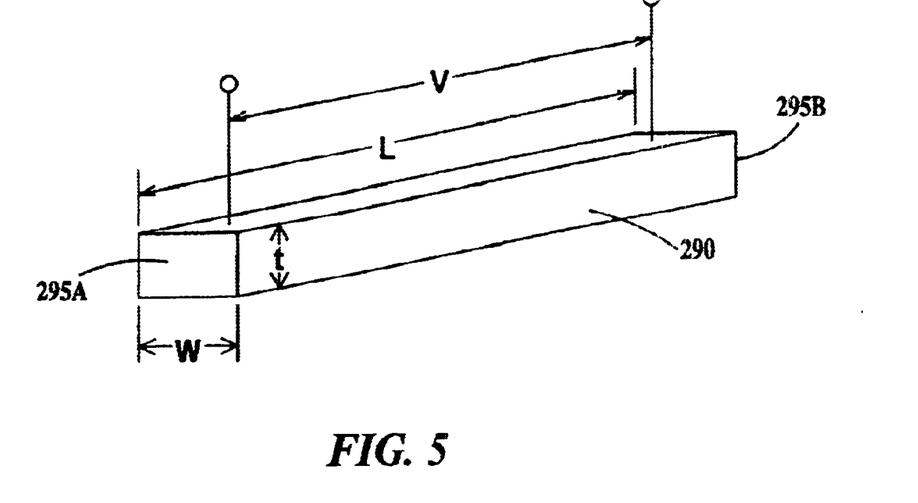
FIG. 5 is a perspective view of a conductive line used as a heating element according to the present invention.

FIG. 5 is a perspective view of a conductive line used as a heating element according to the present invention. Heating element 290 has a length "L," a width "W" and a substantially constant thickness "t." Voltage is applied across heating element 290 from or near opposite ends 295A and 295B. By controlling "W," "t," "V" and the material the temperature reached by line 295 can be controlled. By controlling "L" the total heat energy generated by line 295 can be controlled. As described supra, it can be seen that line 295 will act as a resistive heating element having a linear temperature response to power. Examples of materials from which heating elements according to the present invention may be fabricated from include metals including but not limited to aluminum, copper and alloys thereof, refractory metals including but not limited to tungsten and alloys thereof, doped and undoped polysilicon and doped and undoped monocrystalline silicon. Heating elements may also include the materials just mentioned having one or more layers of titanium, titanium nitride, tantalum, tantalum nitride or combinations thereof formed on one or more surfaces of the heating element.

Thus, the net effect of a heating element adjacent to an antifuse is to increase reliability and yield of integrated circuits and/or increase productivity of integrated circuit manufacture by reducing the risk of damage to integrated circuits due to high programming voltages by controlling temperature and avoiding or reducing programming voltages, making a given antifuse programming voltage more effective and reducing antifuse programming time.

Figure 6A:
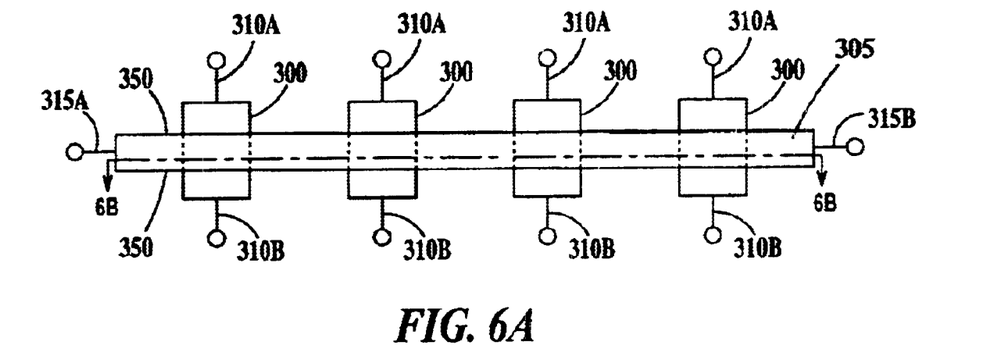
FIG. 6A is a partial top view of a first embodiment of an antifuse structure having a heating element.
Figure 6B:
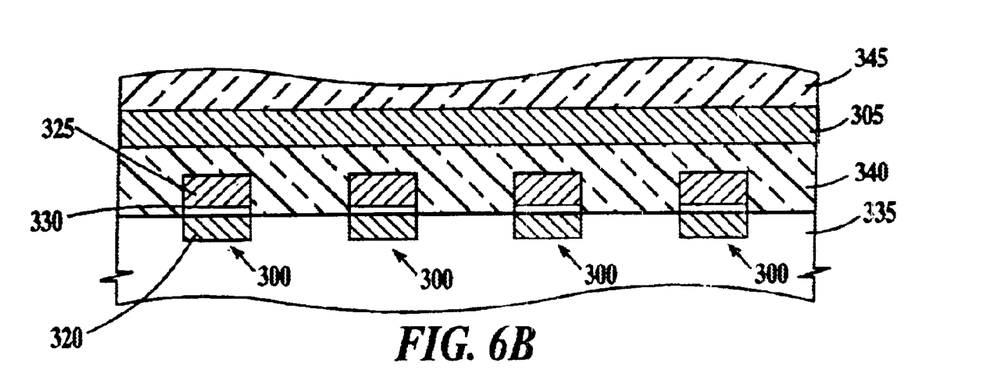
FIG. 6B is a partial cross-sectional view through line 6B—6B of FIG. 6A of the antifuse structure of FIG. 6A.

FIG. 6A is a partial top view of a first embodiment of an antifuse structure having a heating element. FIG. 6B is a partial cross-sectional view through line 6B—6B of FIG. 6A of the antifuse structure of FIG. 6A. In FIGS. 6A and 6B, a multiplicity of antifuses 300 are positioned directly below a heating element 305. In FIG. 6A, electrical connection to each antifuse 300 is provided by a pair of contacts 310A and 310B. Power to heating element 305 is provide through contacts 315A and 315B. Turning to FIG. 6B, each antifuse 300 includes a first plate 320, a second plate 325 and a dielectric layer 330 between and contacting first and second plates 320 and 325. First plate 320 is a doped region formed in a silicon substrate 335. Dielectric layer 330 and second plate 325 are embedded in first insulating layer 340 formed directly on top of silicon substrate 335. Antifuses 300 are similar to antifuse 140 described supra in reference to FIG. 1. Each first and second plate 320 and 325 is contacted by a contacts 310A and a contact 310B (see FIG. 6A) respectively. Heating element 305 is formed directly on top of first insulating layer 340. A second insulating layer 345 is formed directly on top of heating element 305 and directly on top of first insulating layer 340 on either side 350 (see FIG. 6A) of heating element 305. While in FIG. 6B, a single insulating layer 340 intervenes between heating element 305 and antifuses 300, more than one insulating layer may be formed between the antifuses and the heating element. Insulating layer 340 is a relatively thick layer, in excess of about 0.5 micron compared to dielectric layer 330, which is less than about 50 nm thick.

To program antifuses 300, current is forced through heating element 305 causing the heating element to generate heat which radiates to dielectric layer 330 in antifuses 300, causing the temperature of the dielectric layer to increase above ambient temperature. Ambient temperature is defined as the temperature of the substrate containing the antifuse and is usually room temperature, i.e. 20° C. to 30° C. After dielectric layer 330 reaches a desired temperature, a programming voltage is applied across first and second plates 320 and 325 of antifuse 300 causing a break down of dielectric layer 330 and shorting the first and second plates together. Because of the above ambient temperature of dielectric layer 330, the programming voltage used may be lower than that required to cause breakdown at ambient temperature, or the amount of time the programming voltage applied may be reduced from the amount of time used at ambient temperature or both programming voltage and programming time may be reduced.

Figure 7:
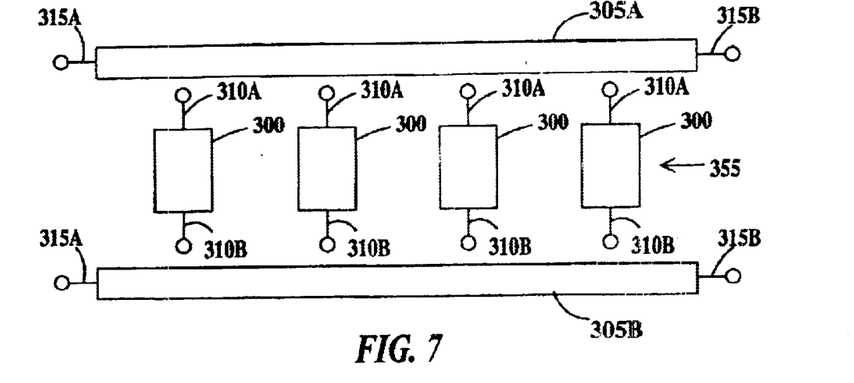
FIG. 7 is a partial top view of a second embodiment of an antifuse structure having a heating.

FIG. 7 is a partial top view of a second embodiment of an antifuse structure having a heating. In FIG. 7, two heating elements 305A and 305B are positioned on top of first insulating layer 340 (see FIG. 6B) above but on either side of a row 355 of antifuses 300. This arrangement allows alternative positioning of contacts (not shown) to antifuses 300.

Figure 8A:
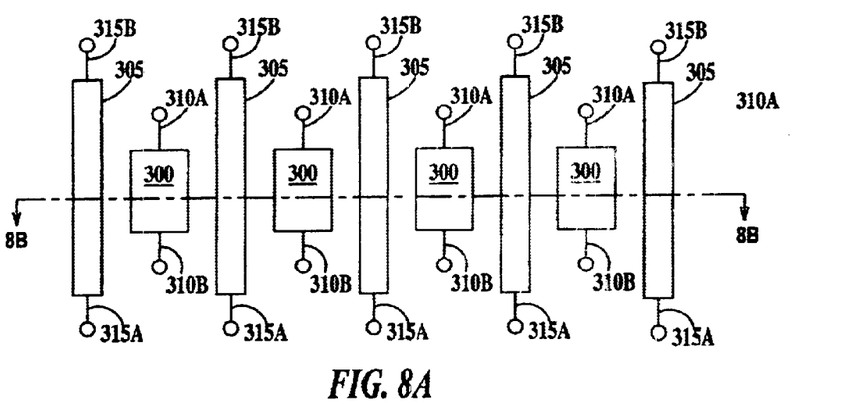
FIG. 8A is a partial top view of a third embodiment of an antifuse structure having a heating element.

FIG. 8A is a partial top view of a third embodiment of an antifuse structure having a heating element. In FIG. 8A, one heating element 305 is positioned between adjacent pairs of antifuses 300. There are three vertical positions in which to place heating elements 305. The vertical direction is defined as that direction perpendicular to the interface between substrate 335 and first insulating layer 340 (see FIG. 6B) with substrate 335 being below first insulating layer 340. These three positions are illustrated in FIGS. 8B1, 8B2 and 8B3 and described infra. This arrangement also allows alternative positioning of contacts (not shown) to antifuses 300.

Figure 8B:
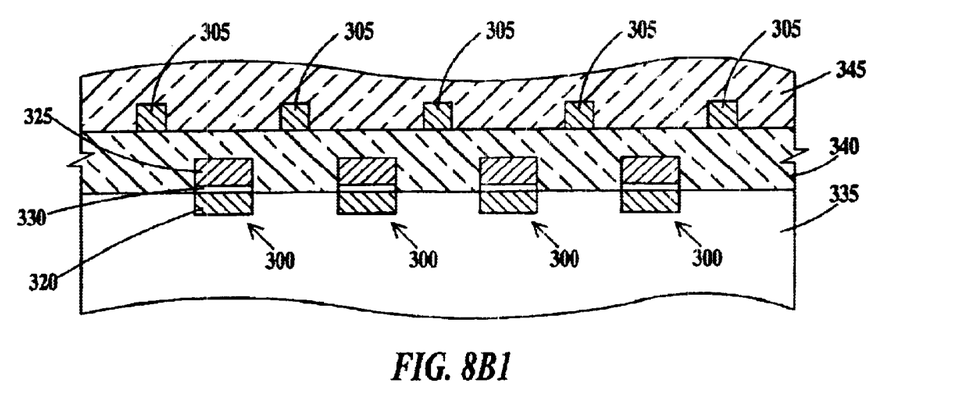

FIG. 8B1 is a partial cross-sectional view through line 8B—8B of FIG. 8A of a first variant of the third embodiment of an antifuse structure having a heating element. FIG. 8B1 is similar to FIG. 6B except heating elements 305 are positioned on top of first insulating layer 340 and aligned between adjacent pairs of antifuses 300.

Figure 8B:
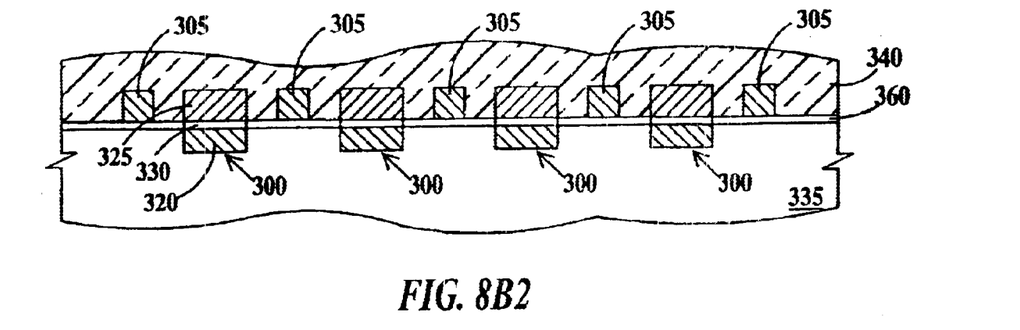

FIG. 8B2 is a partial cross-sectional view through line 8B—8B of FIG. 8A of a second variant of the third embodiment of an antifuse structure having a heating element. FIG. 8B2 is similar to FIG. 8B1 except heating elements 305 are positioned on top of a third insulating layer 360 formed on top of silicon substrate 335 and aligned between adjacent pairs of antifuses 300. Third insulating layer 360 may be an extension of dielectric layer 330 or a separately formed layer. Third insulating layer 360 prevents heater elements 305 from shorting to substrate 335. Third insulating layer 360 may be significantly thicker than dielectric layer 330.

Figure 8B:
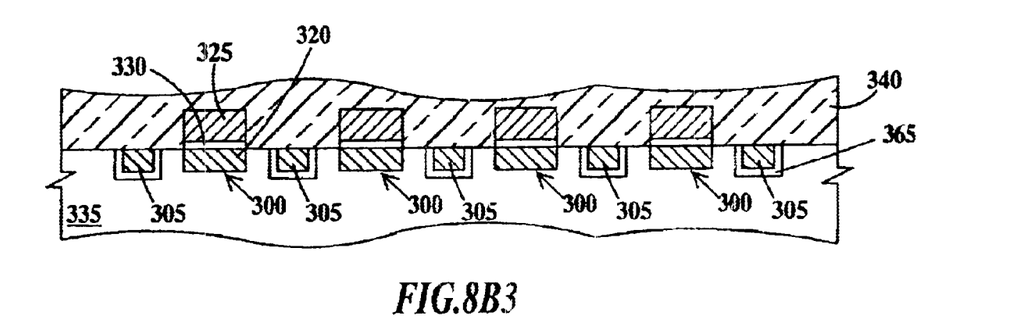

FIG. 8B3 is a partial cross-sectional view through line 8B—8B of FIG. 8A of a third variant of the third embodiment of an antifuse structure having a heating element. FIG. 8B3 is similar to FIG. 8B1 except heating elements 305 are positioned in silicon substrate 335 and aligned between adjacent pairs of antifuses 300. Each heating element 305 is surrounded by an insulator 365. Insulator 365 prevents heater elements 305 from shorting to substrate 335. In the configuration of FIG. 8B3, heater elements 305 may especially be formed from doped or undoped polysilicon or doped or undoped monocrystalline silicon, though any of materials described supra for heating elements may be used.

Figure 9:
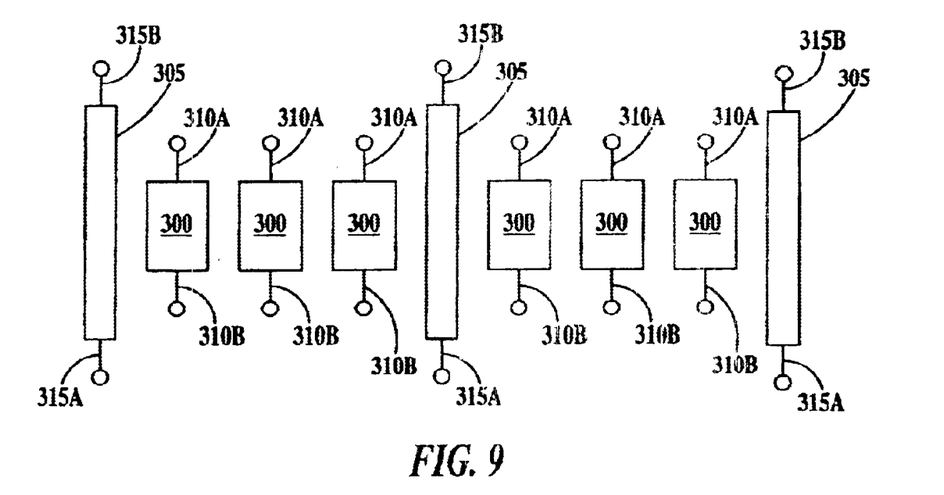
FIG. 9 is a partial top view of a fourth embodiment of an antifuse structure having a heating element.

FIG. 9 is a partial top view of a fourth embodiment of an antifuse structure having a heating element. FIG. 9 is similar to FIG. 8A, the only difference being instead of one antifuse 300 being aligned between adjacent pairs of heating elements 305, multiple antifuses 300 are aligned between adjacent heating elements. It should also be recognized that the three variants illustrated in FIGS. 8B1, 8B2 and 8B3 in terms of the vertical location of heating elements 305 are applicable to the fourth embodiment of the present invention as well.

Figure 10:
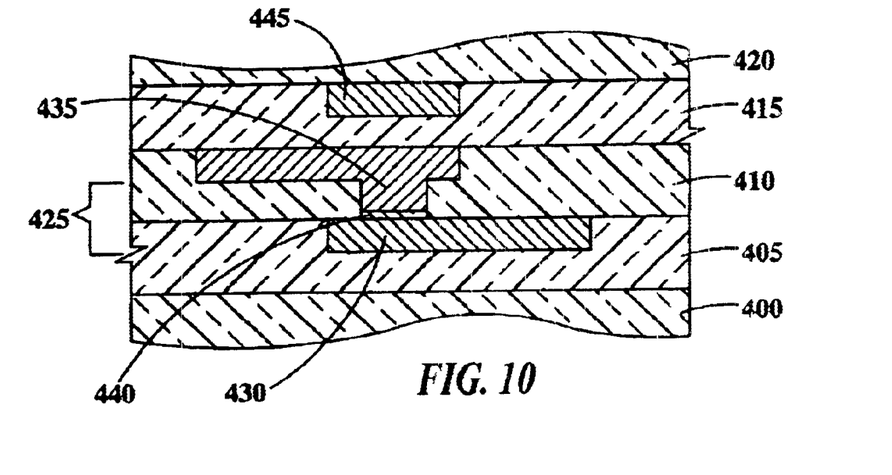
FIG. 10 is a partial cross-sectional view of a fifth embodiment of the present invention.

FIG. 10 is a partial cross-sectional view of a fifth embodiment of the present invention. In FIG. 10, formed directly on top of a first interlevel dielectric 400 is a second interlevel dielectric 405. Formed directly on top of second interlevel dielectric 405 is a third interlevel dielectric 410. Formed directly on top of third interlevel dielectric 410 is a fourth interlevel dielectric 415. Formed directly on top of fourth interlevel dielectric 415 is a fifth interlevel dielectric 420. Antifuse 425 is formed in second interlevel 405 and third interlevel dielectric 410. Antifuse 425 includes a first (lower) conductive plate 430 formed in second interlevel dielectric 405, a second (upper) conductive plate 435 formed in third interlevel dielectric 410 and a dielectric layer 440 in direct contact with and separating the first and second conductive plates. A heating 445 is formed in fourth interlevel dielectric 415 and aligned over antifuse 425. Note that a portion of fourth interlevel dielectric 415 intervenes between heating 445 and antifuse 425.

Antifuses 425 are similar to antifuse 265 described supra in reference to FIG. 2A, but the antifuses 265 illustrated in FIGS. 2B and 2C may be substituted.

To program antifuse 425, current is forced through heating element 445 causing the heating element to generate heat which radiates to dielectric layer 440 in antifuse 425, causing the temperature of the dielectric layer to increase above ambient temperature. After dielectric layer 445 reaches a desired temperature, a programming voltage is applied across first and second conductive plates 430 and 435 of antifuse 425 causing a break down of dielectric layer 440 and shorting the first and second plates together. Because of the above ambient temperature of dielectric layer 440, the programming voltage may be lower than that required to cause breakdown at ambient temperature, or the time the programming voltage applied may be reduced thus decreasing.

Figure 11:
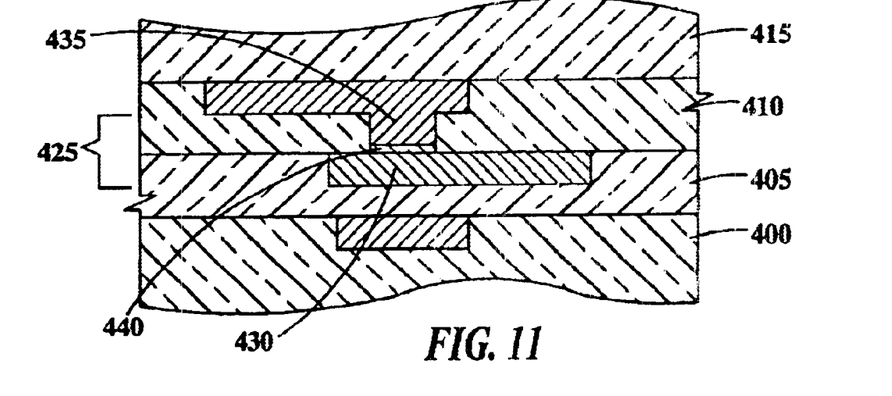

FIG. 11 is a partial cross-sectional view of a sixth embodiment of the present invention. FIG. 11 is similar to FIG. 10 except heating element 445 is formed in first interlevel dielectric layer 400 and aligned under antifuse 425. Note that a portion of second interlevel dielectric 405 intervenes between heating element 445 and antifuse 425.

Figure 12:
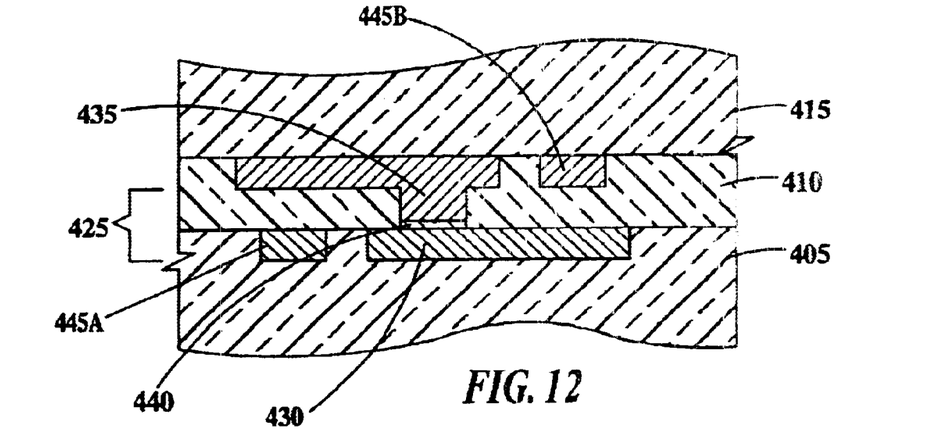
FIG. 12 is a partial cross-sectional view of a seventh embodiment of the present invention.

FIG. 12 is a partial cross-sectional view of a seventh embodiment of the present invention. FIG. 12 is similar to FIG. 10 except a first heating element 445A is formed in second interlevel dielectric 405 adjacent to but not in electrical contact with first conductive plate 430 and a second heating element 445B is formed in third interlevel dielectric 410 adjacent to but not in electrical contact with second conductive plate 435. Note that portions of third interlevel dielectric 410 intervene between heating elements 445A and second conductive plate 435 and between heating 445B and second conductive plate 445B. Further, one or the other of first or second heating elements 445A or 445B may be eliminated.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, instead of straight heating elements, heating elements may be looped or serpentine shaped. Therefore, it is intended that the following claims cover all such modifications and changes as fall within the true spirit and scope of the invention.

What is claimed is:

1. A programmable device comprising:
   an antifuse;
   a resistive heating element having a substantial temperature to power response, said resistive heating element adjacent to but not in contact with said antifuse; and
   means for passing an electric current through said resistive heating element in order to generate heat to raise the temperature of said antifuse sufficiently high enough to decrease a programming voltage of said antifuse, a time said programming voltage is applied to said antifuse or both said programming voltage of said antifuse and said time said programming voltage is applied to said antifuse.

2. The programmable device of claim 1, wherein said heating resistive heating element has a predetermined length and width and a substantially constant thickness.

3. The programmable device of claim 1, wherein said heating element includes materials selected from the group consisting of metals including aluminum, copper and alloys thereof, refractory metals including tungsten, titanium, tantalum and alloys thereof, doped and undoped polysilicon and doped and undoped monocrystalline silicon, titanium nitride and tantalum nitride.

4. The programmable device of claim 1, further including one or more additional resistive heating elements, each additional resistive heating element having a substantially temperature to power response, each said additional resistive heating element adjacent to but not in contact with said antifuse.

5. The programmable device of claim 1, wherein said antifuse comprises, before programming, a first conductive plate, a second conductive plate, said first and second conductive plates electrically isolated from each other by a dielectric between and in direct contact with said first and second conductive plates.

6. The programmable device of claim 5, wherein said programming voltage causes electrical breakdown of said dielectric.

7. The programmable device of claim 5, wherein said first or second or both first and second conductive plates includes materials selected from the group consisting of metals including aluminum, copper and alloys thereof, refractory metals including tungsten, titanium, tantalum and alloys thereof, doped and undoped polysilicon and doped and undoped monocrystalline silicon, titanium nitride and tantalum nitride.

8. The programmable device of claim 1, wherein said resistive heating element is formed in a silicon substrate.

9. The programmable device of claim 1, wherein said heating element is formed in a different interlevel dielectric or insulating layer than said antifuse.

10. The programmable device of claim 1, wherein said heating element is formed in at least one interlevel dielectric or insulting layer that said antifuse is formed in.

11. A method of programming an antifuse comprising:
    providing an antifuse;
    providing a resistive heating element having a substantially temperature to power response, said resistive heating element adjacent to but not in contact with said antifuse;
    passing an electric current through said resistive heating element in order to generate heat to raise the temperature of said antifuse sufficiently high enough to decrease a programming voltage of said antifuse, a time said programming voltage is applied to said antifuse or both said programming voltage of said antifuse and said time said programming voltage is applied to said antifuse; and
    passing said programming voltage through said antifuse to form an electrically conductive path through said antifuse.

12. The method of claim 11, wherein said heating resistive heating element has a predetermined length and width and a substantially constant thickness.

13. The method structure of claim 11, wherein said heating element includes materials selected from the group consisting of metals including aluminum, copper and alloys thereof, refractory metals including tungsten, titanium, tantalum and alloys thereof, doped and undoped polysilicon and doped and undoped monocrystalline silicon, titanium nitride and tantalum nitride.

14. The method of claim 11, further including:

providing one or more additional resistive heating elements, each additional resistive heating element having a substantially temperature to power response, each said additional resistive heating element adjacent to but not in contact with said antifuse; and passing said electric current through each additional resistive heating element.

15. The method of claim 11, wherein said antifuse comprises, before programming, a first conductive plate, a second conductive plate, said first and second conductive plates electrically isolated from each other by a dielectric between and in direct contact with said first and second conductive plates.

16. The method of claim 15, wherein said programming voltage causes electrical breakdown of said dielectric.

17. The method of claim 15, wherein said first or second or both first and second conductive plates includes materials selected from the group consisting of metals including aluminum, copper and alloys thereof, refractory metals including tungsten, titanium, tantalum and alloys thereof, doped and undoped polysilicon and doped and undoped monocrystalline silicon, titanium nitride and tantalum nitride.

18. The method of claim 11, further including forming said resistive heating element in a silicon substrate.

19. The method of claim 11, further including forming said heating element and said antifuse in a different interlevel dielectric or insulating layers.

20. The method of claim 11, further including forming said heating element and said antifuse in at least one common interlevel dielectric or insulating layer.

* * * * *